(12) United States Patent
Krokoszinski

(10) Patent No.: US 9,209,321 B2
(45) Date of Patent: Dec. 8, 2015

(54) SOLAR CELL

(75) Inventor: Hans-Joachim Krokoszinski, Nussloch (DE)

(73) Assignee: SolarWorld Industries Thueringen GmbH, Arnstadt (DE)

( * ) Notice: Subject to any disclaimer, the term of this patent is extended or adjusted under 35 U.S.C. 154(b) by 261 days.

(21) Appl. No.: 13/643,648

(22) PCT Filed: Mar. 1, 2011

(86) PCT No.: PCT/EP2011/052954
§ 371 (c)(1),
(2), (4) Date: Jan. 4, 2013

(87) PCT Pub. No.: WO2011/134700
PCT Pub. Date: Nov. 3, 2011

(65) Prior Publication Data
US 2013/0104975 A1 May 2, 2013

(30) Foreign Application Priority Data

Apr. 26, 2010 (DE) .......................... 10 2010 028 189

(51) Int. Cl.
*H01L 31/0224* (2006.01)
*H01L 31/068* (2012.01)
(Continued)

(52) U.S. Cl.
CPC .......... *H01L 31/0224* (2013.01); *H01L 31/028* (2013.01); *H01L 31/022425* (2013.01);
(Continued)

(58) Field of Classification Search
CPC ........................ H01L 31/028–31/0288; H01L 31/03682–31/03685; H01L 31/0516; H01L 31/0682; H01L 31/0224–31/022458; H01L 31/022491

USPC .................................................. 136/243–265
See application file for complete search history.

(56) References Cited

U.S. PATENT DOCUMENTS 6,337,283 B1  1/2002  Verlinden et al.
2007/0107773 A1*  5/2007  Fork et al. ..................... 136/256
(Continued)

FOREIGN PATENT DOCUMENTS

DE   195 15 666    10/1996
DE   19525720     1/1997
(Continued)

OTHER PUBLICATIONS

International Search Report for PCT/EP2011/052954, dated Apr. 19, 2012.
(Continued)

*Primary Examiner* — James Lin
*Assistant Examiner* — Liesl C Baumann
(74) *Attorney, Agent, or Firm* — Maginot, Moore & Beck LLP

(57) ABSTRACT

A solar cell includes: a passivating layer sequence having a plurality of island-like recesses from which the passivating layers have been completely removed; a thin first metal layer situated on the passivating layer sequence and situated in the recesses on the substrate surface; a thin dielectric cover layer covering the first metal layer which has a first regular arrangement of narrow line-type openings and a second regular arrangement of essentially wider line-type or extended island-type openings, the first and second opening arrangement being aligned at an angle; and a highly conductive second metal layer able to be soldered at the exposed surface in the openings of the first and second opening arrangement and contacts the first metal layer there.

9 Claims, 3 Drawing Sheets

(51) Int. Cl.
 *H01L 31/028* (2006.01)
 *H01L 31/18* (2006.01)

(52) U.S. Cl.
 CPC  *H01L31/022433* (2013.01); *H01L 31/022441* (2013.01); *H01L 31/022491* (2013.01); *H01L 31/0682* (2013.01); *H01L 31/18* (2013.01); *H01L 31/1804* (2013.01); *Y02E 10/547* (2013.01)

(56) References Cited

U.S. PATENT DOCUMENTS

| | | | | |
|---|---|---|---|---|
| 2007/0295399 | A1* | 12/2007 | Carlson | 136/261 |
| 2008/0128020 | A1* | 6/2008 | Zafar et al. | 136/252 |
| 2009/0111206 | A1* | 4/2009 | Luch | 438/59 |
| 2009/0114276 | A1* | 5/2009 | Shan et al. | 136/256 |
| 2009/0238994 | A1* | 9/2009 | Mette et al. | 427/554 |
| 2009/0283143 | A1 | 11/2009 | Krause et al. | |
| 2009/0301559 | A1* | 12/2009 | Rohatgi et al. | 136/256 |
| 2010/0000597 | A1* | 1/2010 | Cousins | 136/255 |
| 2010/0037939 | A1* | 2/2010 | Eickelmann et al. | 136/255 |
| 2010/0055822 | A1 | 3/2010 | Weidman et al. | |
| 2010/0218816 | A1* | 9/2010 | Guha et al. | 136/256 |
| 2011/0073154 | A1* | 3/2011 | Nishida | 136/244 |
| 2011/0253211 | A1* | 10/2011 | Krokoszinski | 136/256 |
| 2013/0112259 | A1* | 5/2013 | Krokoszinski | 136/256 |

FOREIGN PATENT DOCUMENTS

| | | | |
|---|---|---|---|
| DE | 10 2007 059 486 | | 6/2009 |
| DE | 10 2008 013 446 | | 8/2009 |
| DE | 10 2008 017 312 | | 10/2009 |
| DE | 10 2008 020 796 | | 11/2009 |
| DE | 10 2008 033 169 | | 11/2009 |
| DE | 102010027940 | A1 * | 10/2011 |
| JP | 9-501268 | | 2/1997 |
| JP | 2001-189475 | | 7/2001 |
| JP | 2005 027 309 | | 1/2005 |
| WO | WO 2010049229 | A2 * | 5/2010 |
| WO | WO 2010049268 | A1 * | 5/2010 |
| WO | WO 2010049275 | A1 * | 5/2010 |

OTHER PUBLICATIONS

Laserstrahlverfahren zur Fertigung kristalliner Silizium-Solarzellen (Laser Beam Method for Producing Crystalline Silicon Solar Cells), Dissertation by Eric Schneiderlöchner, Albert-Ludwigs-Universität Freiburg im Breisgau (2004).

Verlinden P., et al., "Multlevel Metallization for Large Area Point-Contact Solar Cells", Proceedings of the 20th IEEE Photovoltaic Spec. Conf., Sep. 26, 1988 pp. 532-537.

Ansgar Mette: "New Concepts for Front Side Metallization of Industrial Silicon Solar Cells", Nov. 27, 2007, pp. 45-49 and 74-84.

A Goetzberger et al., "Sonnenenergie: Photovoltaik" (Solar Energy: Photovoltaics), B. G. Teubner Stuttgart, 1997 (pp. 138-149).

* cited by examiner

SOLAR CELL

BACKGROUND OF THE INVENTION

1. Field of the Invention

The present invention relates to the domain of semiconductor components, especially solar cells, and relates to a crystalline solar cell having an n- or p-doped semiconductor substrate and a passivated backside.

2. Description of the Related Art

Silicon solar cells having a "passivated backside" have improved optical aluminizing and a greatly improved passivation of the back surface compared to the aluminum back surface field (BSF) that has been produced in a standard manner up to now, cf. A Götzbarger et al., "Sonnenenergie: Photovoltaik" (Solar Energy: Photovoltaics), B. G. Teubner Stuttgart, 1997. The cell concept produced thereby is called "Passivated Emitter and Rear Cell" (PERC). In this context, the dielectric passivation adapted to the backside doping is opened locally at many small points, so that the metal layer deposited on the passivating layer is not able to contact the semiconductor, but only at a small surface portion of the backside, in order to minimize the strong recombination of the electron hole pairs at metallized surfaces.

The metallizing of the backside is made up in most cases of aluminum, and is deposited over a large surface on the entire backside, as a rule, using vacuum vapor deposition technology or sputtering.

Documents relating to such solar cells as well as methods for their production, and are connected to backside patterning steps and/or the backside driving in of doping substances, are the likes of published German patent document DE 195 25 720 C2, published German patent application document DE 10 2007 059 486 A1 or published German patent application document DE 10 2008 013 446 A1, as well as published German patent application document DE 10 2008 033 169 A1 (both of the latter from ErSol Solar Energy AG).

Such documents as published Japanese patent application document JP 2005 027 309 A, DE 10 2008 017 312 A1 or published German patent application document DE 10 2008 020 796 A1 are concerned with the efficient production of reliable connecting patterns, particularly those having soldered connections.

The method "laser fired contacts" (LFC) is known, in which the metallization is fired through on the backside passivation using laser pulses, so that a prior opening of the passivating layer becomes unnecessary, cf. "Laserstrahlverfahren zur Fertigung kristalliner Silizium-Solarzellen" (Laser Beam Method for Producing Crystalline Silicon Solar Cells), Dissertation by Eric Schneiderlöchner, Albert-Ludwigs-Universität Freiburg im Breisgau (2004) or (earlier) published German patent application document DE 199 15 666 A1.

In the case of p-doped wafers, the formation of "local BSF regions" at the contact points in the backside passivation is undertaken simply by alloying the aluminum into the p- or $p^+$ surface. This takes place at temperatures above the Al—Si eutectic temperature of 577° C. For this it is necessary that the backside passivation layer and also the front side emitter (after the sintering of the front side silver paste) survive these temperatures undamaged.

In the case of n-doped wafers, in which the emitter (p-n junction) is produced on the backside using boron or aluminum doping, the formation of the Al—Si eutectic, which, as a rule, would melt a few micrometers in depth, would lead to a breakthrough through the thin $p^+$ emitter into the n-base and there it would lead to a short circuit to the base. For that reason, the metallization has to be tempered at low temperatures (e.g. 400° C., optionally also in forming gas), in order to produce a sufficiently good ohmic contact to the emitter surface, without damaging the cell. This makes impossible the firing of a normal screen printing paste for the subsequent depositing of a silver layer, that is able to be soldered, on the aluminum.

All the PERC technologies, known from the related art, have the following disadvantages:

1.) It is common to all the concepts that the backside is present at the end of the process having a large-surface aluminum layer, which does not have solderable pad areas.
2.) The low ohmicity of the metallization required for the current conduction is only able to be produced via a sufficiently thick aluminum layer, as a rule, 2-4 µm. If the vapor deposition or sputter rate is selected to be high, in order to keep the processing times low, the heat input, and with that, the temperature of the wafer in the process chamber, increase greatly. If the rate is held to be low, more time or a longer passage system having additional deposit or sputtering sources for the aluminum coating have to be provided. In any case, the compromise is connected to higher investment and or processing costs.
3.) One alternative is a thinner aluminum layer which is able to be produced in a sufficiently short period of time at a moderate deposition rate, but then a chemical or galvanic reinforcement of the Al backside metallization is required. This takes place, though, at very moderate temperatures (<90° C.) and thus represents no thermal stress of the almost ready solar cells.
4.) If one found a suitable method for reinforcing aluminum chemically or galvanically, however, the entire backside would be reinforced with silver, which would represent a considerable cost factor.

BRIEF SUMMARY OF THE INVENTION

The solar cell proposed is distinguished by a thin dielectric cover layer covering the first metal layer, which has a first regular arrangement of narrow line-type openings and a second regular arrangement of essentially wider line-type or extended island-type openings, the first and second opening arrangement being aligned at an angle, particularly transversely to each other. It is distinguished further by a highly conductive second metal layer that is able to be soldered at the exposed surface in the openings of the first and second opening arrangement which contacts the first metal layer there.

The solar cell according to the present invention, having a passivated and large area metalized backside, which was reinforced chemically or galvanically in the narrow finger areas and current collecting busbar or soldering pad areas that were opened in the dielectric cover layer, has in any case, in expedient embodiments, the following advantages compared to the related art:

1.) In addition to the large area aluminum layer having local contacts to the semiconductor surface, that was usual up to now, the solar cell also has areas capable of being soldered (busbars or soldering pads)
2.) The chemically/galvanically reinforced (i.e. very conductive fingers on the backside collect the current everywhere on the large wafer area and conduct it on, in a low ohmic manner, to the busbars or pads. The generated current, proceeding from the local contact points out of the solar cell, has to cover only a small distance up to the next plating finger in the metal layer sequence. Therefore, this metal layer sequence is able to be made up of very thin metal layers, such as a 0.1 µm nickel seed layer. Thus, it is able to be produced, at moderate deposition rates, in so short a time that the cells are not heated up too much.

3.) Even after the finished production of the chemical or galvanic reinforcement by the dielectric cover layer, the large area metal layer sequence remains protected over a lifetime of 25 years from chemical attack, such as corrosion in the module.

4.) The thin metallization and the local subsequent reinforcement, differently from the screen printing metallization of the backside that was typical up to now, do not lead to wafer bending. This makes it possible further to reduce the wafer thickness/cell thickness, and thereby save costs for silicon.

In one embodiment that is technical and expedient from a cost point of view, the second metal layer has at least one metal from the group including Pd, Ni, Ag, Cu and Sn. In this instance, the second layer in particular has a sequence of metal layers, particularly the layer sequence Pd/Ni/Ag or Ni/Cu/Sn.

Moreover, it is provided that the second metal layer be produced by a chemically or galvanically deposited reinforcement layer.

One additional design provides that the thin dielectric cover layer has at least one material from the group including silicon oxide, silicon nitride, aluminum oxide, aluminum nitride and titanium oxide.

In a first variant the substrate involves a p-doped silicon substrate having a phosphorus-doped emitter on the first main surface. In one embodiment alternative to this, the semiconductor substrate is an n-doped silicon substrate having a boron or aluminum-doped $p^+$ emitter on the second main surface.

In particular, the first and second openings in the thin dielectric cover layer are formed by masked ion etching, especially in the same system in which the cover layer is produced. Alternatively to this it may be provided that the first and second openings in the thin dielectric cover layer are formed by laser ablation or by etching while using an etching paste that is applied using screen printing or inkjet pressure.

DETAILED DESCRIPTION OF THE INVENTION

It remains open in all the figures whether a p-doped or an n-doped wafer is involved. In the case of the n-material, the emitter may be situated either on the front side or the backside. In the latter case, as a rule, a doping for a front surface field (FSF) is produced on the front side.

Figure 1:
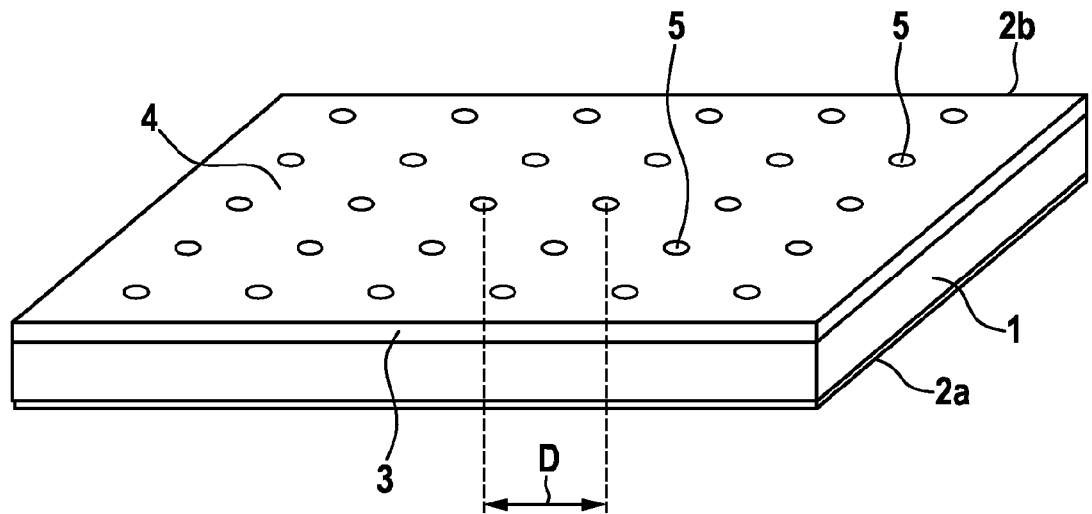
FIGS. 1 to 3 show an initial situation as well as a first and second process section of the production of a specific embodiment of the solar cell according to the present invention, in perspective schematic representations.

The starting point of the following description is an almost completely produced solar cell that may be contacted on both sides on p- or n-doped silicon 1 (FIG. 1). Assume front side 2a has already been processed completely, i.e. doped homogeneously or selectively, having a passivation/antireflection layer or layer sequence, and being provided with a solderable contact grid. Backside 2b may be undoped or may contain a homogeneous doping 3, which represents an emitter or a BSF. The surface is coated using chemical vapor deposition (CVD) or physical vapor deposition (PVD, that is, vapor deposition or sputtering) using a passivating layer or layer sequence 4, selected and optimized with respect to doping polarity and doping concentration, which has been locally removed (opened) using a technique known per se from the related art. The point grid thus created, in which the local contact openings 5 are situated, goes by the layer resistance of the surface: in the case of undoped surfaces (PERC cell) the distance apart of points D is less than for doped surfaces (PERT cell, that is, full surface doped cell).

Figure 2:
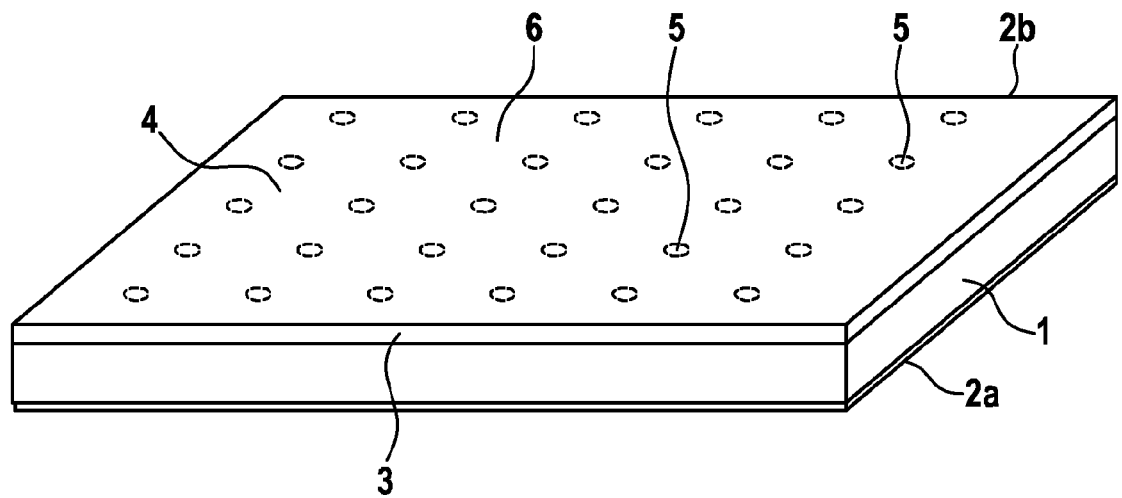

The first process step according to the present invention begins with the full-surface coating (known per se from the related art) using a metal layer sequence 6 (FIG. 2), either vapor deposition or sputtering technique being able to be used. In this context, for instance, aluminum may be involved, which is covered optionally in the same system using a thin (not shown) nickel-containing seed layer for the later chemical or galvanic reinforcement. As an alternative, of course, other metals or metal layer sequences may be selected, e.g. titanium/palladium/silver or chrome-nickel/nickel/silver.

Finally, in all cases (in the same system, without interrupting the vacuum) the entire backside is covered with a thin dielectric thin layer 7. In this context, all deposited layers lie both on passivating layer sequence 4 and on the semiconductor surface exposed in local openings 5 in the passivating layer. Cover layer 7 may be an oxide or a nitride of the aluminum or the silicon. It may be vapor-deposited or sputtered reactively from the metal target or deposited using RF sputtering from the dielectric target.

Figure 3:
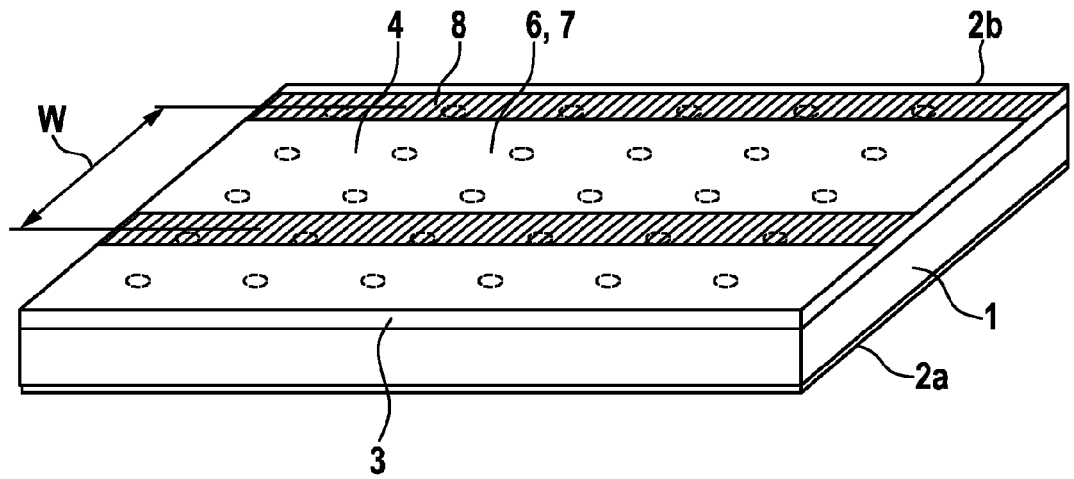

In the second step, using a suitable technique, the dielectric cover layer is opened (FIG. 3) in the form of many, narrow lines 8 that are preferably equidistant from and situated parallel to one another. In this context, for example, the following techniques may be used, that are known per se from the related art: laser ablation, screen-printed or inkjet-printed etching paste, inkjet-masked wet chemical etching. The distance W of parallel openings 8 is typically of the order of magnitude of 1 mm to 10 mm, preferably 2 mm to 5 mm. The width of the openings is typically about 100 µm to 1 mm, preferably 200 µm to 500 µm.

Figure 4A:
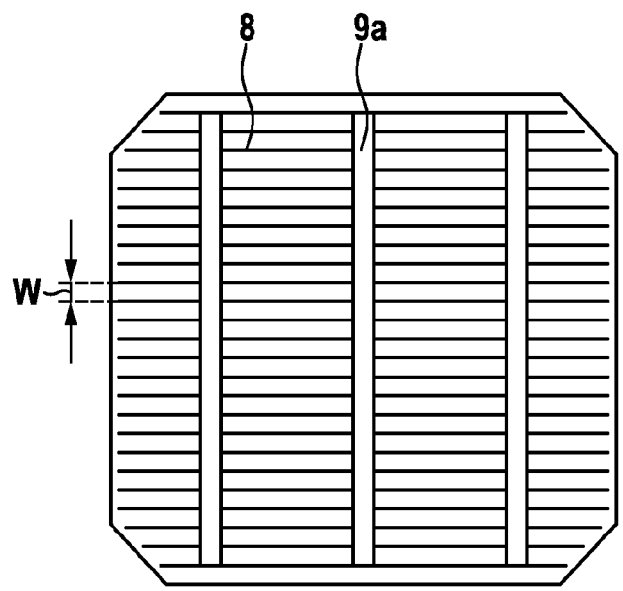
FIGS. 4A and 4B show schematic top views of two embodiments of a contact pattern of the solar cell.
Figure 4B:
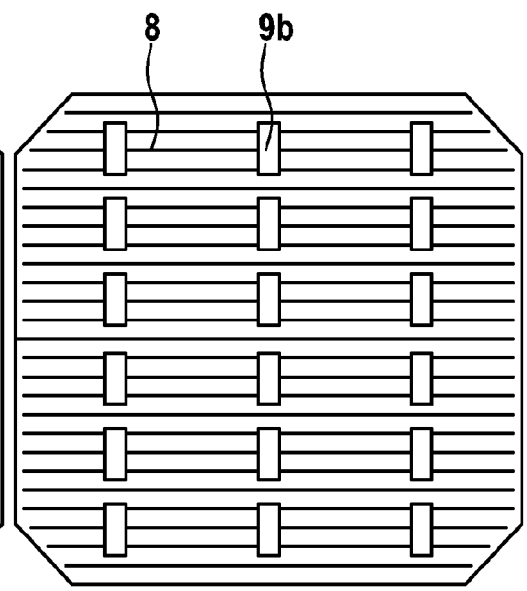
Figure 5:
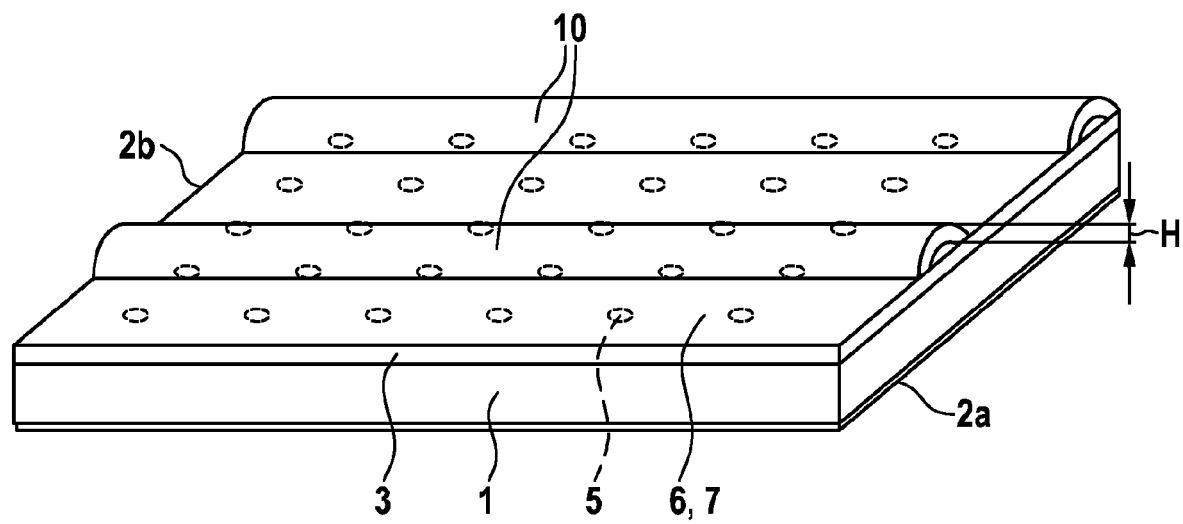
FIGS. 5 and 6 show a third process section in schematic perspective representations.
Figure 6:
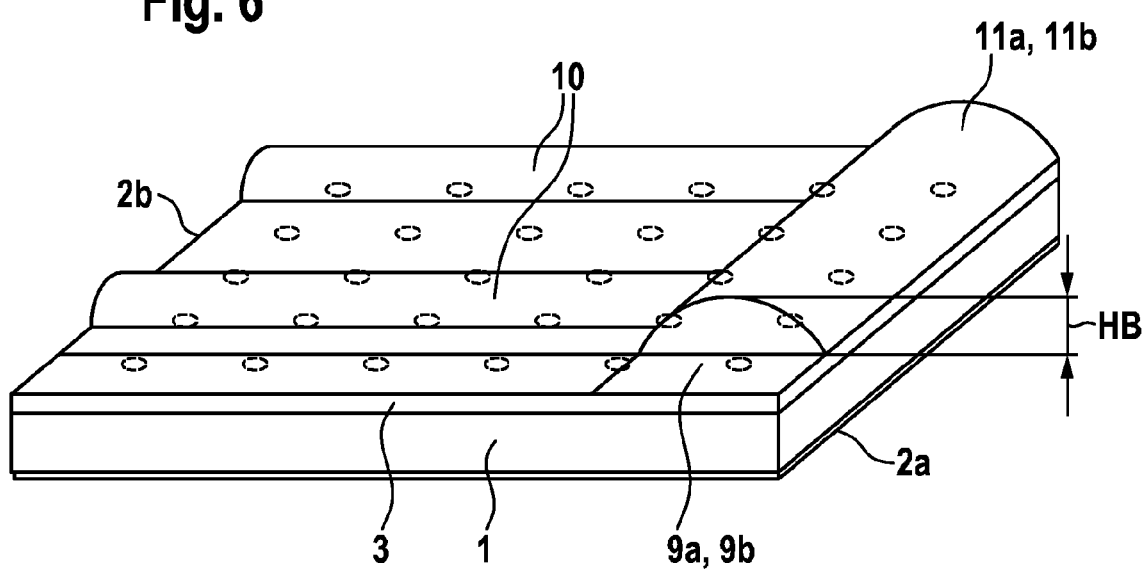

At 90° to the course of narrow openings 8, wider areas 9a or 9b are opened simultaneously, i.e. in the same opening step, in the dielectric cover layer, in which later solderable busbars and soldering pads are to be produced. Busbar strips 9a (FIG. 4A) may have any width desired that is optimized for the soldering process. It might also be only 2 busbars. Pad areas 9b (FIG. 4B) may be as many as desired and designed as big as desired. They may be situated along 2 or 3 lines, depending on the number and the position of the busbars on the front side. In the third step, the metal surface lying open in openings 8, 9a, 9b in the cover layer is reinforced in a suitable chemical or galvanic depositing process using a very well conducting and well solderable metal layer sequence (FIG. 5). In this context, depending on the exposed metal, for example, palladium, nickel and silver or nickel, copper and tin may be involved. If aluminum having a nickel seed layer has been selected, nickel is deposited with a high probability in the first bath, which is then still covered with a sufficient quantity of silver. In the same reinforcement process, the wider busbar areas or pad areas 9a or 9b are also postreinforced and made solderable 11 FIG. 6) using the same layer sequence. The postreinforced narrow fingers 10 open out either directly into the reinforced busbar areas 11a or soldering pad areas 11b, or into narrow connecting lines between the pads (cf. FIG. 4).

Incidentally, the execution of the method is not restricted to the abovementioned examples and emphasized aspects, but only by the range of protection of the appended claims.

What is claimed is:

1. A solar cell, comprising:
   a semiconductor substrate made of silicon and having a first main surface used as an incident light side and a second main surface used as a backside;
   a passivating layer sequence situated on the second main surface, wherein the passivating layer sequence has a plurality of island-type recesses in which passivating layer material has been completely removed;
   a thin first metal layer situated on the passivating layer sequence and in the recesses such that the first metal layer covers the entire backside of the substrate;
   a thin dielectric cover layer covering the first metal layer, wherein the thin dielectric cover layer has a first regular arrangement of narrow line-type openings and a second regular arrangement of one of wider line-type openings or extended island-type openings, the openings of the first and second regular arrangement extending through the dielectric layer and exposing portions of a surface of the first metal layer, wherein the first regular arrangement of openings and the second regular arrangement of openings are aligned substantially transversely to each other; and
   a conductive second metal layer which contacts, and is able to be soldered at, the portions of the surface of the first metal layer exposed by the openings of the first regular arrangement and the openings of the second regular arrangement.

2. The solar cell as recited in claim 1, wherein the second metal layer includes at least one of Ni, Cu and Sn.

3. The solar cell as recited in claim 2, wherein the second metal layer is made up of a sequence of metal layers including Ni, Cu, and Sn.

4. The solar cell as recited in claim 3, wherein the first metal layer includes at least one of Al and Ni.

5. The solar cell as recited in claim 4, wherein the first metal layer is made up of a sequence of metal layers including Al and Ni.

6. The solar cell as recited in claim 3, wherein the second metal layer has one of a chemically or galvanically deposited reinforcement layer.

7. The solar cell as recited in claim 3, wherein the thin dielectric cover layer has at least one of silicon oxide, silicon nitride, aluminum oxide, aluminum nitride and titanium oxide.

8. The solar cell as recited in claim 3, wherein the semiconductor substrate is a p-doped silicon substrate having a phosphorus-doped emitter on the first main surface.

9. The solar cell as recited in claim 3, wherein the semiconductor substrate is an n-doped silicon substrate having one of a boron-doped or aluminum-doped p+-emitter on the second main surface.

* * * * *